United States Patent [19]

Yamada et al.

[11] Patent Number: 5,278,428
[45] Date of Patent: Jan. 11, 1994

[54] THIN FILM MEMORY CELL

[75] Inventors: Hiroyasu Yamada, Hino; Hiroshi Matsumoto, Tachikawa; Syunichi Sato, Kawagoe, all of Japan

[73] Assignee: Casio Computer Co., Ltd., Tokyo, Japan

[21] Appl. No.: 720,895

[22] Filed: Jun. 25, 1991

[30] Foreign Application Priority Data

Jun. 28, 1990 [JP] Japan .................. 2-171969
Aug. 31, 1990 [JP] Japan .................. 2-230916
Apr. 11, 1991 [JP] Japan .................. 3-78965

[51] Int. Cl.$^5$ .................. H01L 29/04; H01L 31/036; H01L 31/20; H01L 27/108
[52] U.S. Cl. ........................ 257/66; 257/52; 257/57; 257/69; 257/315; 365/182
[58] Field of Search .......... 257/52, 66, 69, 321, 257/315, 296, 316, 57

[56] References Cited

U.S. PATENT DOCUMENTS

| 4,590,503 | 5/1986 | Harari et al. ............ 257/316 |
| 4,667,217 | 5/1987 | Janning .................. 257/66 |
| 4,905,072 | 2/1990 | Komatsu et al. ......... 257/66 |
| 5,070,378 | 12/1991 | Yamagata ............... 257/315 |

FOREIGN PATENT DOCUMENTS 0367152 10/1989 European Pat. Off. .

Primary Examiner—Rolf Hille
Assistant Examiner—Wael Fahmy
Attorney, Agent, or Firm—Frishauf, Holtz, Goodman & Woodward

[57] ABSTRACT

A memory cell has a thin film memory transistor and a thin film selective transistor. The thin film memory transistor has a charge trapping structure and a positive-negative-charge occurrence structure. The charge trapping structure includes a first thin film semiconductor layer, an insulating memory gate layer formed on the first thin film semiconductor layer, and a memory gate electrode. The positive-negative-charge occurrence structure includes an impurity high density layer with a portion facing the memory gate electrode. The thin film selective transistor is coupled to the thin film memory transistor in a serial form and has an only n-channel occurrence structure which includes a second thin film semiconductor layer, an insulating selective gate layer formed on the second thin film semiconductor layer and being thicker than the insulating memory gate layer, and a selective gate electrode formed on said insulating selective gate layer.

14 Claims, 15 Drawing Sheets

THIN FILM MEMORY CELL

BACKGROUND OF THE INVENTION

1. Field of the Invention

The present invention relates to an electrically writable and erasable thin film memory.

2. Description of the Related Art

The EEP ROM (Electrically Erasable and Programmable Read Only Memory) is generally known as an electrically writable and erasable memory transistor. Further, the EEP ROM is likewise known to come in an MNOS structure and a floating gate structure, both of which uses a tunnel effect. Structurally precise with the EEP ROM, over the surface of a silicon substrate, there are provided a tunnel oxide film, a charge trapping insulating film, and a gate electrode in respective layers. Functionally concrete with the EEP ROM, it is found that applying a high voltage between the gate electrode and the substrate brings forth the tunnel effect, whereby the electrons or the positive holes, collectively referred to as the charges, pass through the tunnel oxide film, and subsequently get trapped in a boundary between the tunnel oxide film and the charge trapping insulating film or another boundary between the silicon substrate and the tunnel oxide film. Trapping the charges in one of these boundaries makes the threshold voltage shift in a direction opposite to the direction in a case with the trapping the same type of the charges in another boundary. Shifting a polarity of the threshold voltage to negativity concurs with the emergence of an erased (post-erasure) state wherein a drain current occurs constantly. Meanwhile, shifting to the positive polarity of the threshold voltage signifies the presence of a written (post-write) state where no drain current obtains even an ON-voltage applied. Of particular note is a fact that the charges trapped in one of these boundaries are kept unchanged after removal of the ON-voltage. This demonstrates the physical characteristic of a non-volatile memory. However, as the conventional EEP ROM is manufactured from a silicon water, it is required to provide source regions and drain regions within a P-well, field insulating films to isolate memory transistors to each other, and so on. This causes the production process to become complex, to fail higher efficiency, and further renders an EEP ROM structure to be unfit for circuit integration.

To make up for these disadvantages, some attempts are currently under way with a view to realizing such a non-volatile memory, following the TFT technology. Though difference from the above-remarked EEP ROM over the drive procedure, a memory cell structure is disclosed in U.S. Pat. No. 4,667,217 which is considered serviceable for reference to achieve a TFT (Thin Film Transistor) memory cell. In the prior art disclosed in said U.S. Patent, the non-volatile memory device is of a TFT structure. However, with this memory device, it is of such a configuration devised for electrons only avalanche, namely of a single charge channel (N-channel) run arrangement. Therefore, there exists no feasibility to expand the width of hysteresis. In other words, no practicality is available to increase the difference between the respective threshold voltages in the post-write and post-erasure states. This coincides with not only unpracticality to grow the ratio between the respective drain currents in the written state and erased state but also low accuracy in charge potential level discrimination.

SUMMARY OF THE INVENTION

It is therefore an object of the present invention to provide a TFT structure-furnished memory cell allowing high productivity and which is devised capable of incrementing the drain current ratio between the written and erased states, each with no voltage applied.

The thin film memory cell according to the present invention is defined in the claims below.

A memory cell having electrically writable and electrically erasable functions comprises:

a thin film memory device having a charge trapping structure and a positive-negative-charge occurrence structure; the charge trapping structure including a first thin film semiconductor layer, an insulating memory gate layer formed on the first thin film semiconductor layer, and a memory gate electrode; the positive-negative-charge occurrence structure including an high-density impurity layer with a portion facing the memory gate electrode; and a thin film selective device electrically coupled to said thin film memory device in a serial form and having an only n-channel occurrence structure which includes a second thin film semiconductor layer, an insulating selective gate layer formed on the second thin film semiconductor layer and being thicker than the insulating memory gate layer, and a selective gate electrode formed o the insulating selective gate layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

First Preferred Embodiment

Now, with reference to the drawings attached hereto, the first preferred embodiment of the present invention is described hereunder.

FIGS. 1 through 12 illustrate the first preferred embodiment of a thin film memory cell of the present invention. FIGS. 1 through 5 are each an enlarged sectional view showing the thin film memory cell in each process of production.

The thin film memory cell 1 of this embodiment comprises a memory transistor 10 and a selection transistor 11 as described later. The selection thin film transistor 11 is of a coplanar structure while the thin film memory transistor 10 is of a stagger structure.

Figure 1:
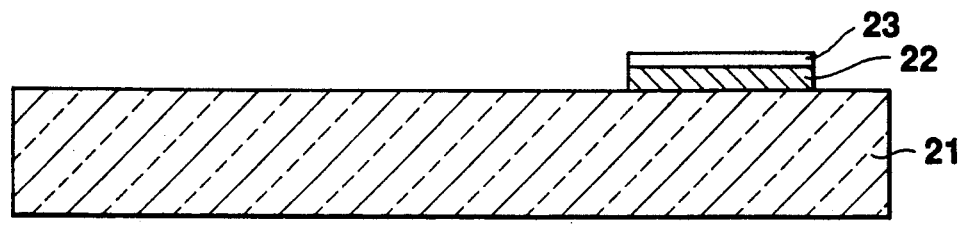
FIGS. 1 through 5 are each an enlarged sectional view showing the structure of the thin film memory cell of a first embodiment of the present invention in each process of production, and illustrating how said memory cell is manufactured.

As illustrated in FIG. 1, on the surface of an insulating substrate 21 of glass or the like, an electrically conductive substance such as chromium (Cr) and polysilicon with $n^+$ high density impurity realized through doping phosphorus (P) ions or arsenic (As) ions are deposited in respective layers in this sequence. The deposited conductive substance and polysilicon are patterned by plasma etching or the like to form a source electrode 22 and an $n^+$ polysilicon layer 23.

Figure 2:
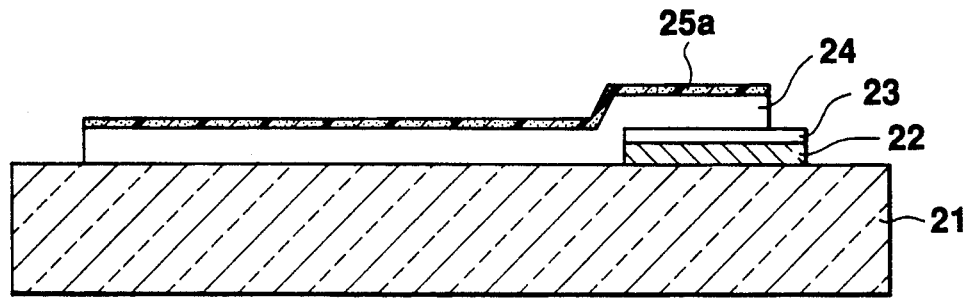

Successively, as illustrated in FIG. 2, on the surface of the insulating substrate 21 with the source electrode 22, a semiconductor substance such as amorphous polysilicon, etc., and silicon-rich silicon nitride are thinly (approximately 100 Å) deposited. These two layers are patterned to form semiconductor layer 24 and a silicon nitride film 25a. The silicon-rich silicon nitride referred to above is prepared with the content of silicon increased up to 0.85 through 1.1 larger than a Si/N stoichiometrical ratio of 0.75, and thus rendered a charge trap function.

Figure 3:
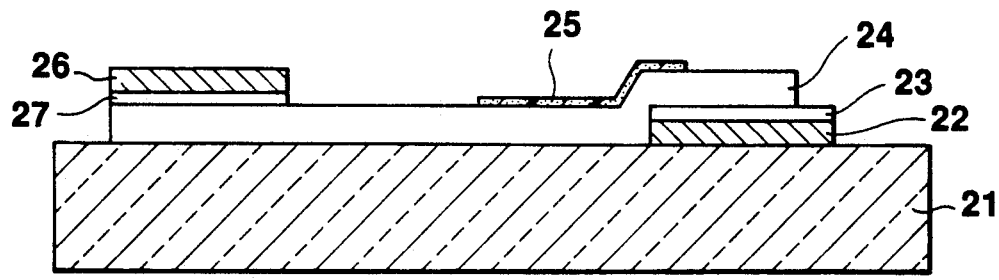

Subsequently, as shown in FIG. 3, said silicon nitride film 25a is patterned to leave only a portion thereof that will face a memory gate electrode 30 described later so that a silicon nitride memory film 25 is formed. Then, on the surface of the resultant structure, phosphorus ion-doped polysilicon, and an electrically conductive substance comprising chromium (Cr), etc. are sequentially deposited in respective layers. These two layers are patterned to form a drain electrode 26 and an $n^+$ high-density impurity layer 27. The semiconductor layer 24 and drain electrode 26, and the semiconductor layer 24 and source electrode 22 are brought into an ohmic contact with one another, respectively through directly coupling the $n^+$ high-density impurity polysilicon layers 23 and 27.

Figure 4:
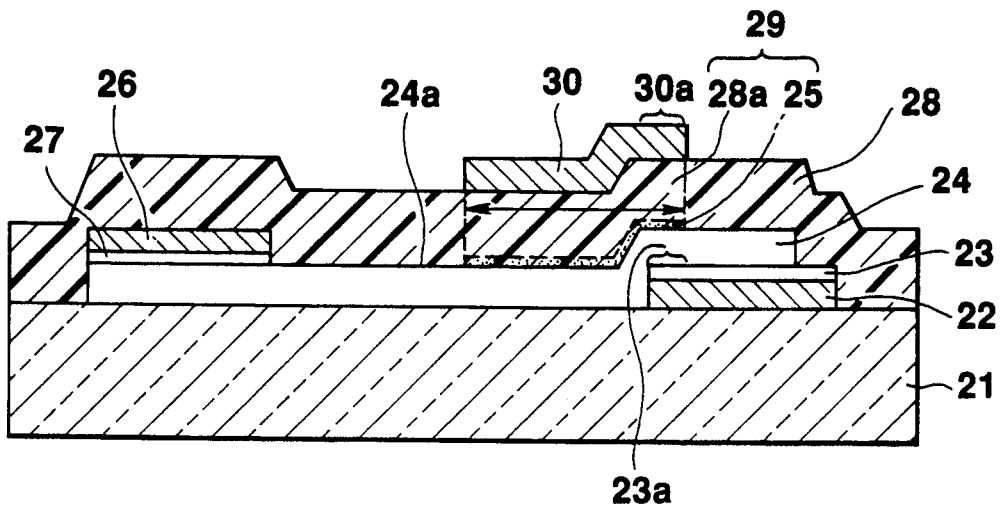

Thereafter, as illustrated in FIG. 4, on the resultant structure, a memory gate insulating film 28 comprising silicon nitride with the stoichiometrical ratio equal to 0.75 is deposited. The silicon nitride memory film 25 and a part 28a (see FIG. 4) of the gate insulating film 28 make up a memory gate insulating film 29. Next, on the gate insulating film 28, an electrically conductive substance such as chromium or the like is deposited. With patterning the layer of the electrically conductive substance, a memory gate electrode 30 of the memory transistor is formed. The memory gate electrode 30 is formed at the location facing said the silicon nitride memory film 25. Of particular notice here is a fact that one end 30a of the memory gate electrode 30 is overlapped with one end 23a of the $n^+$ polysilicon layer 23 laid between the semiconductor layer 24 and the source electrode 22. When applying a high voltage between the memory gate electrode 30 and source electrode 22, this structure generates electronpositive hole pairs.

Figure 5:
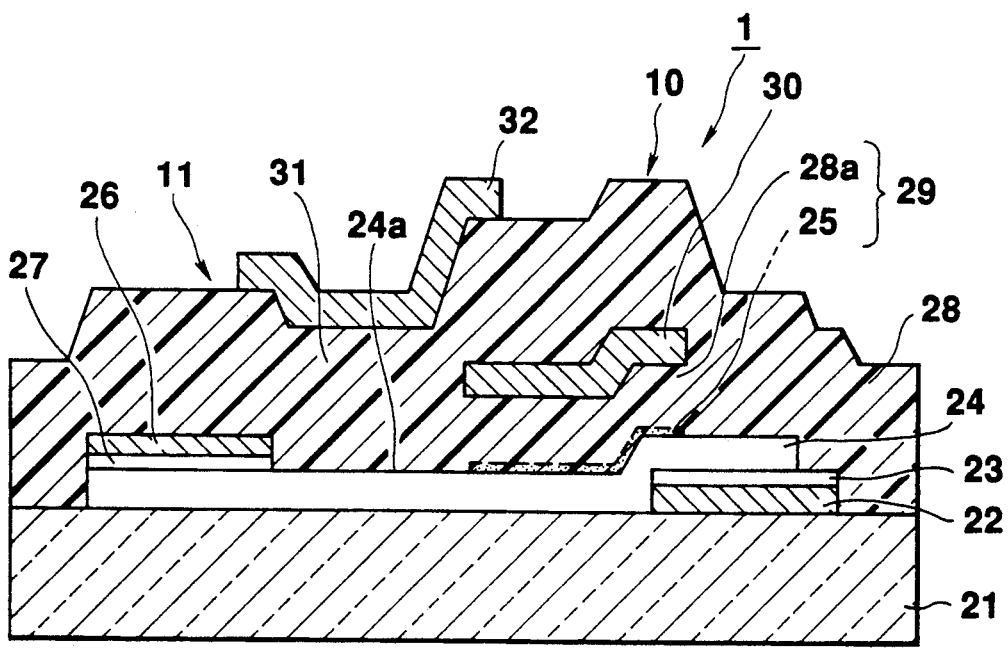

Then, as presented in FIG. 5, on the memory gate electrode 30 and the gate insulating film 28, a selective gate insulating film 31 of silicon nitride is formed by a plasma CVD process or the like. The Si/N ratio of the selective gate insulating film 31 is selected as 0.75. Subsequently, on the selective gate insulating film 31, an electrically conductive substance such as chromium or the like are deposited. The layer of the electrical conductive substance is patterned to form a selective gate electrode 32 whereby to complete a thin film memory cell 1. It should be noted that both of the silicon nitride memory film 25 and the gate insulating film 28 are formed of the silicon nitride. Therefore, these two layer 25 and 28 can be formed merely by varying the flow ratio of reactive gases of silane (SiH$_4$) to ammonia (NH$_4$).

The thin film memory cell 1 comprises the selective transistor 11 of the coplaner structure including the selective gate electrode 32, gate insulating film 31, drain electrode 26, source electrode 22, and semiconductor layer 24, and the memory transistor 10 of the stagger structure including the memory gate electrode 30, memory gate insulating film 29, semiconductor layer 24, drain electrode 26, and source electrode 22. In short, the thin film memory cell 1 is of such a configuration wherein the planer structural selective transistor 11 is formed on the surface of the stagger structural memory transistor 10.

Figure 6:
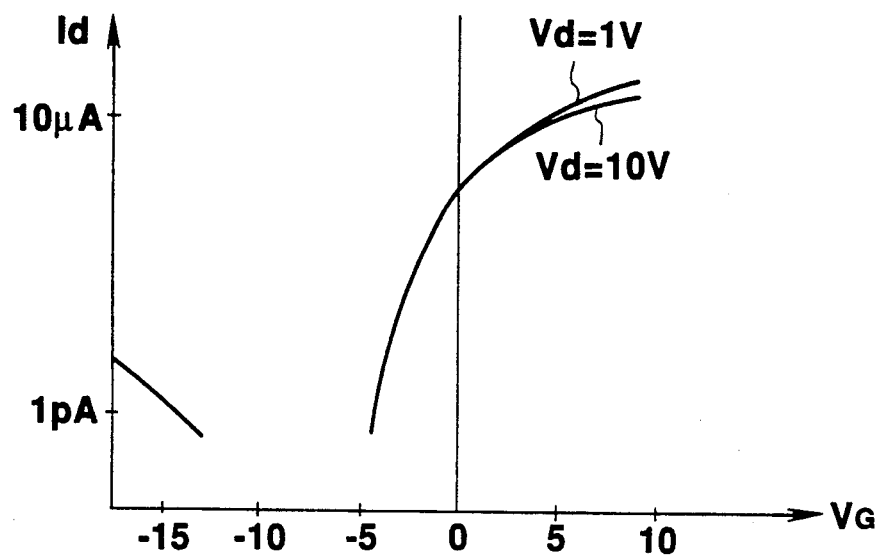
FIG. 6 is a diagram showing the $V_G$-$I_d$ characteristic of a selective transistor illustrated in FIG. 5.
Figure 7:
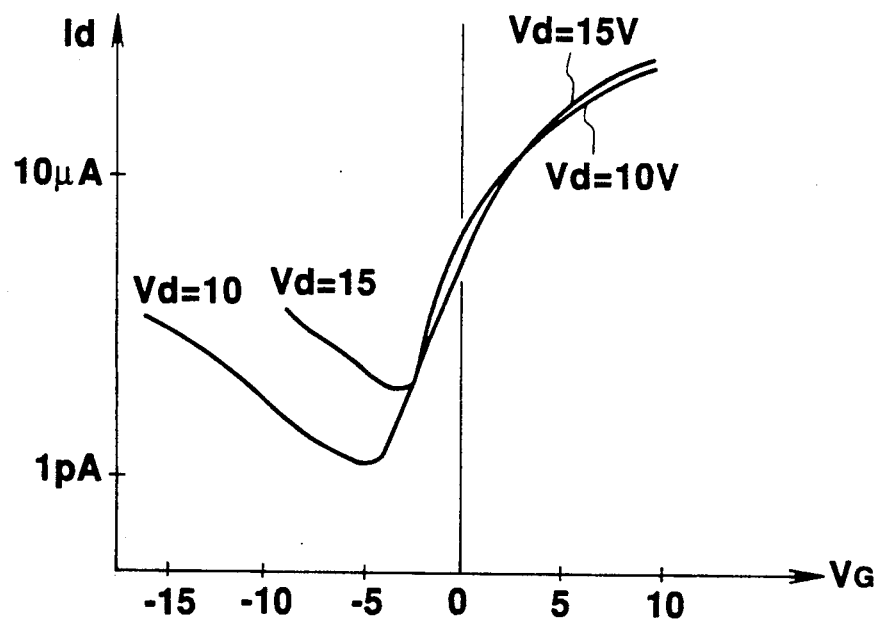
FIG. 7 is a diagram showing the $V_G$-$I_d$ characteristic of a memory transistor illustrated in FIG. 5.

FIG. 6 presents the $V_G$-$I_D$ characteristic of the selective transistor 11, and FIG. 7 the $V_G$-$I_D$ characteristic of the memory transistor 11. As illustrated in FIG. 6, the selective transistor 11 provides a drain current (1 $\mu$A) when $V_G$ exceeds approximately 0 V, but fails to provide the drain current at the time the polarity of $V_G$ becomes negative. This signifies that the selective transistor 11 is of an N-channel type in which the electrons serve as carriers. Namely, the selective transistor is of such a configuration wherein no positive holes are generated as carriers, but instead, electrons are produced, whereby the mobility of carriers is improved.

Meanwhile, as showing in FIG. 7, since the memory transistor 10 is configurationally allowed to apply each of both positive holes and electrons as carriers, depending on the direction of the electric field lying between the memory gate electrode 29 and the source electrode 22. Therefore, it can be said that the memory transistor 10 is of an N-P-composite channel type. In this memory transistor, the n+ high impurity polysilicon layers 23 and 27 are used, whereby an efficient generation of positive hole-electron pairs is assured, with the result that the mobility of carriers is favorable in each of the P-channel or N-channel type run.

Figure 8:
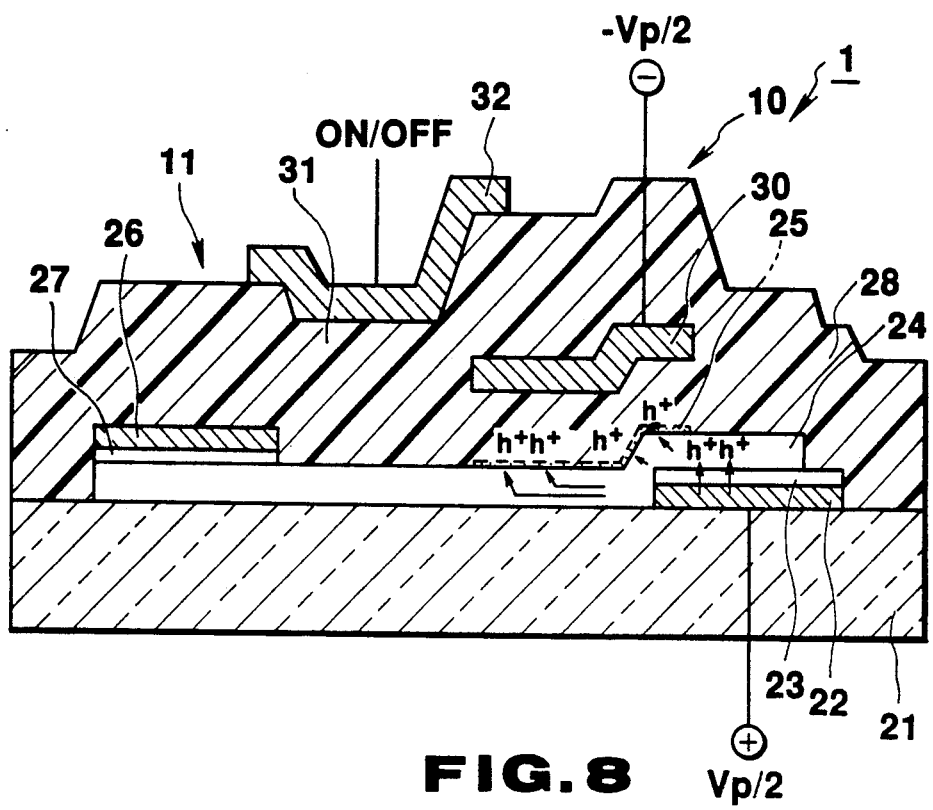
FIG. 8 is an enlarged sectional view illustrating how the data written in the thin film memory cell presented in FIG. 5 are erased.
Figure 9:
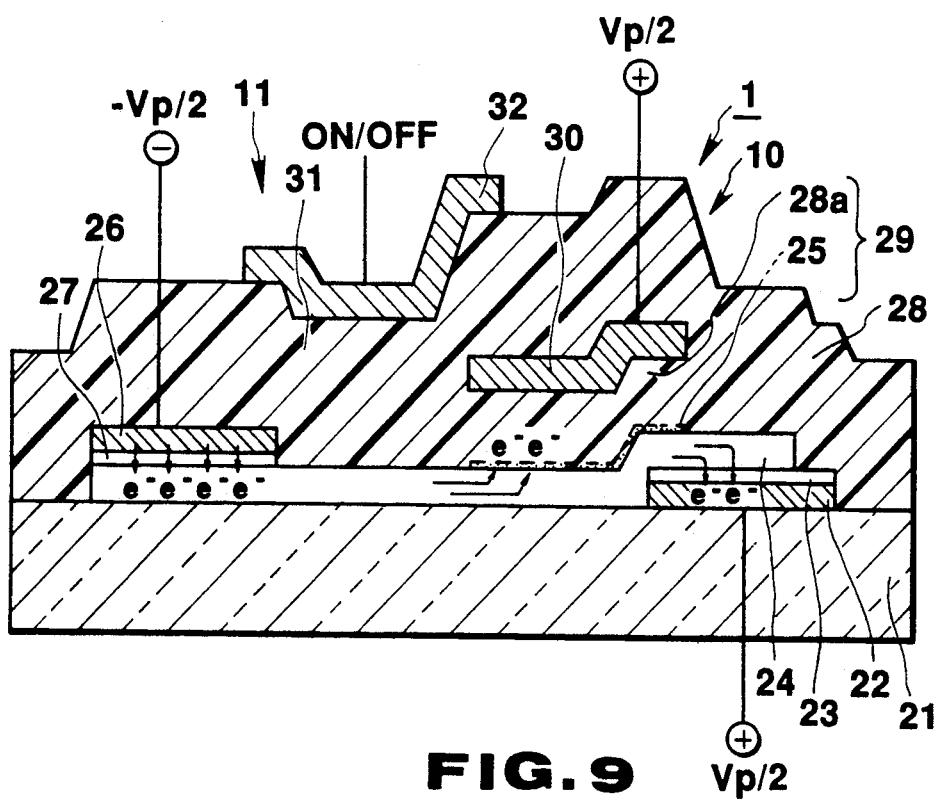
FIG. 9 is an enlarged sectional view illustrating how to write data into the thin film memory cell presented in FIG. 5.
Figure 10:
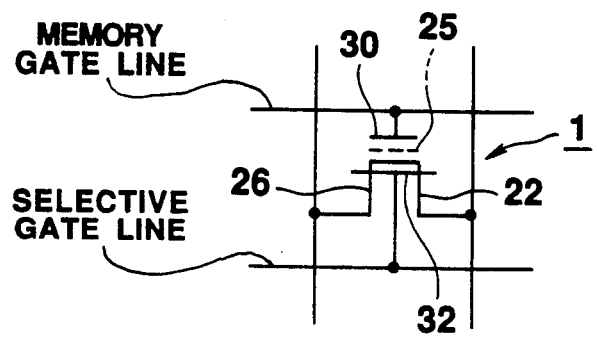
FIG. 10A is a circuit diagram illustrating a circuit configuration of the thin film memory cell given in FIG. 5.
FIG. 10B is an equivalent circuit diagram of the thin film memory cell given in FIG. 10A.
Figure 10:
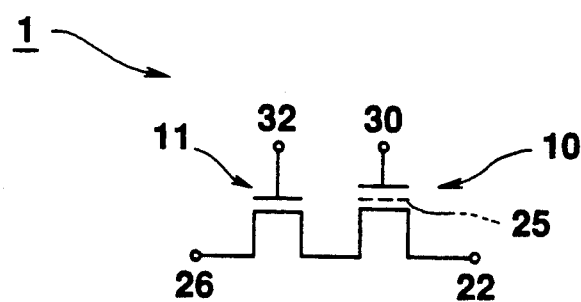

Next, with reference to FIGS. 8 and 9, how erasure and writing are implemented in the thin film memory cell 1 are described hereunder. In each of FIGS. 8 and 9, there is illustrated only one thin film memory cell 1. Practically, however, a plurality of thin film memory cells 1 are arranged in a matrix form to fabricate a memory device.

First, erasure is effected through the injection of positive holes into the silicone nitride memory film 25. More precisely, as shown in FIG. 8, the memory gate electrode 30 is applied with a negative bias voltage while a positive bias voltage is applied to the source electrode 22 so that the positive holes (h+ in FIG. 8) may get trapped into the silicon nitride memory film 25, whereby the contents previously written into the silicon nitride memory film 25 are erased. For example, in the step of erasure, $-V_p/2$ is applied to the memory gate 30 of the thin film memory cell 1 which is slated to have its contents erased, $V_p/2$ is supplied to both source electrode 22 and the drain electrode 26, and $-V_p/2$ is applied to the selective gate electrode 32. The positive holes h+ gets trapped into the silicon nitride memory film 25 as shown in FIG. 8.

On the other hand, for the thin film memory cells 1 whose contents should not to be erased, $V_p/2$ is applied to the memory gate electrode 30, the potential of which is identical with the voltages applied to the source electrode 22 and the drain electrode 26. Further the voltage $V_p/2$ is applied to the selective gate electrode 32 of the selective transistor 11. This results in relieving the memory transistor 10 of undergoing a change of the charge holding state. In an erasure process, the positive holes get trapped into the silicon nitride memory film 25 under an erasure voltage $-V_p$ applied between memory gate 30 and source electrode 22, regardless of ON-OFF of the selective transistor 11.

Then, how writing is implemented in each thin film memory cell is described hereunder.

Writing is done through the injection of electrons into the silicon nitride memory film. To implement the writing, a positive bias voltage is impressed to the memory gate electrode 30 while a negative bias voltage is applied to the drain electrode 26. Here, the potential of the source electrode 22 is set identical with that of the memory gate electrode 30. Since selection of the memory transistor 10 is done via an N-channel provided within the channel region of the selective transistor 11. FIG. 9 illustrates a flow of electrons e− on each side of the N-channel by arrows. In FIG. 9, $V_p/2$ for example is applied to the source electrode 22 and the memory gate electrode 30 while $-V_p/2$ is impressed to the drain electrode 26. Further applying $V_p/2$ to the selective gate electrode 32 under the condition referred to above brings the selective transistor 11 into an ON-state, whereby the memory transistor 10 is selected for writing data therein.

In the meantime, applying $-V_p/2$ to the selective gate electrode 32 concurs with driving the selective transistor 11 into an OFF-state, whereby it is prohibited to write data into the memory transistor 10.

FIG. 10A is a circuit diagram of the thin film memory cell 1 according to the embodiment of the present invention, and FIG. 10B presents an equivalent circuit of the circuit illustrated in FIG. 10A. As can be appreciated from these figures, the thin film memory cell 1 is of a structure wherein the stagger structural memory transistor 10 and the coplaner structural selective transistor 11 are serially connected to each other.

Figure 11:
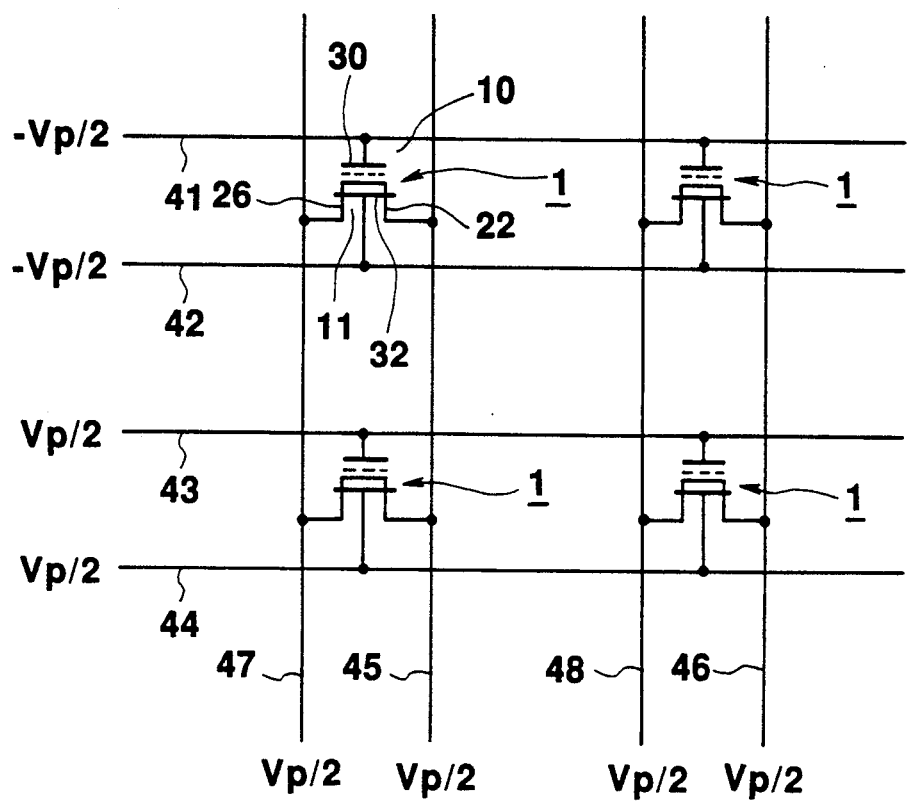
FIG. 11 is a circuit diagram showing how to erase data stored in a memory device with the thin film memory cells arranged in a matrix form, illustrated in FIG. 5.
Figure 12:
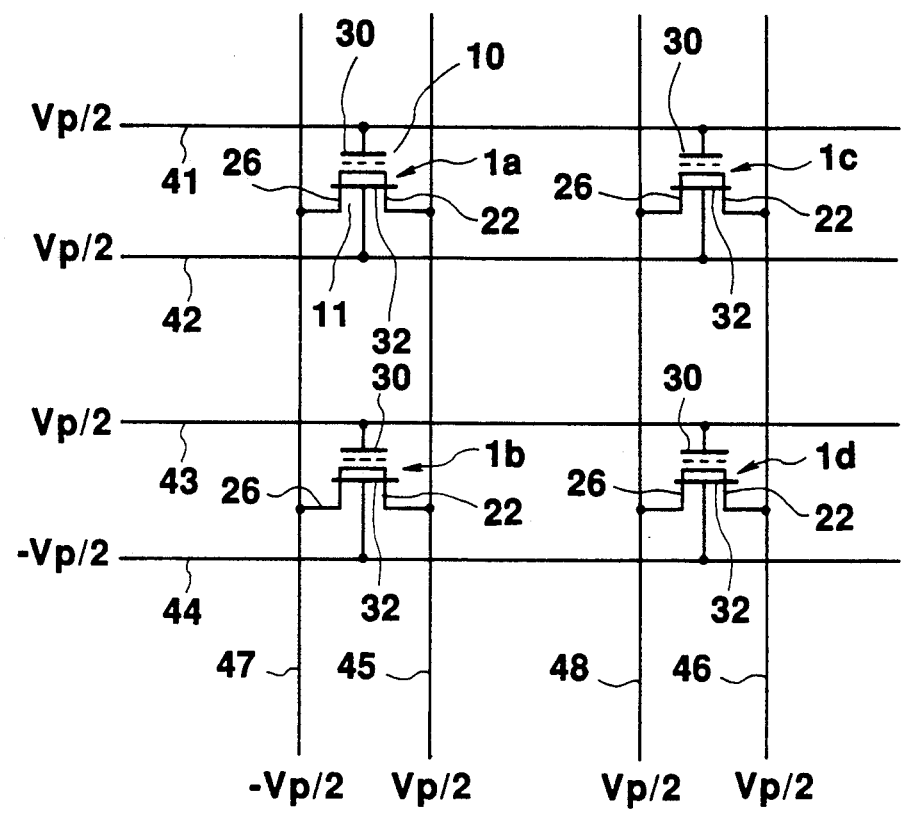
FIG. 12 is a circuit diagram showing how to write data into the memory device with the thin film cells—illustrated in FIG. 5—arranged in the matrix form.

FIGS. 11 and 12 show each a circuit diagram of the memory device with a plurality of said thin film memory cells 1 arranged in a matrix form. Each of said thin film memory cells 1 comprises the memory transistor 10 and the selective transistor 11 which are electrically coupled serially, both being shown in FIG. 10B.

Now, referring to these figures, how the erasure and the writing are implemented in the memory device 1 is described hereunder.

To effect the erasure, as shown in FIG. 11, $-V_p/2$ is applied to a memory gate line 41 coupled to the memory gate 30 of the thin film memory cell 1 which is about to go through erasure of its contents, with a selective gate line 42 coupled to the selective gate electrode 32 likewise applied with $-V_p/2$. While another thin film memory cell 1 which is not due to undergoing the erasure, has its memory gate line 43 and selective gate line 44 impressed commonly with $V_p/2$, with data lines 45 and 46 applied with $V_p/2$, which are coupled commonly to the source electrode 22, and further with $V_p/2$ impressed respectively to data lines 47 and 48 which are connected commonly to the drain electrode 26.

The voltage applied between the respective gate sources of the thin film memory cell 1 coupled to the memory gate line 41 is being $V_p$, whereby the contents of the memory cells 1 in the row are collectively erased. As for the thin film memory cell 1 of the memory device which is not about to undergo the erasure of the contents, the memory gate 30, selective gate electrode 32, drain electrode 26, and source electrode 22 have their potentials commonly regulated at $V_p/2$, whereby it is prohibited that the contents written previously in said thin film memory cell 1 are erased.

Next, a description is also made hereunder of how the writing is effected in the memory device.

Four different reference alpha-numeric symbols are allocated for four thin film memory cells 1 presented in FIG. 12. Namely, as specified in FIG. 12, 1a denotes the thin film memory cell on the upper row of a left column, 1b the thin film memory cell on the lower row of the left column while 1c stands for the thin film memory cell on the upper row of a right column and 1d the thin film memory cell on the lower row of the right column. One thin film memory cell 1a out of these is focused to illustrate how the writing is effected therein, with reference to FIG. 12.

In this case, $V_p/2$ is applied respectively to the memory gate liens 41 and 43, as well as to the selective gate line 42 while $-V_p/2$ is impressed to a data line 47, $V_p/2$ is simultaneously applied to respective data lines 45, 46, and 48. Thus, in the thin film memory cell 1a, the potential of the memory gate electrode 30 is $+V_p$ with respect to the potential of the drain electrode 26 while the potential of the selective gate electrode 32 is $+V_p$ with respect to the potential of the drain electrode 26. As described above, the selective transistor 11 is of the N-channel type. Therefore, applying $+V_p$ to the selective gate electrode 32 takes place with driving the selective transistor 11 into the ON-state, whereby data is written into the memory transistor 10.

Commonly with the thin film memory cells 1c and 1d, their respective memory gate electrodes 30, selective gate electrodes 32, drain electrodes 26, and source electrodes 22 have their potentials regulated uniformly at $V_p/2$, whereby the selective transistor 11 is in the OFF-state. The contents in the memory transistor 10 remaining unchanged.

Next with the thin film memory cell 1b, the potential of the memory gate electrode 30 is $+V_p$ in reference to the potential of the drain electrode 26. However, in this case, the potential of the selective gate electrode 32 is equal to that of the drain electrode 26 but it exhibit $-V_p$ with respect to the potential of the source electrode 22. The selective transistor 11 is of the N-channel type. Therefore, when the potential of the selective gate electrode 32 is negative as compared with the potential of the source electrode 22, the selective transistor 11 stays in the OFF-state, whereby data is not written in the thin film memory cell 1b.

In the case of a memory device illustrated in FIGS. 11 and 12, data-writing is done for each bit in unit while erasure is undertake for each line in unit, as already described.

In the above-remarked first preferred embodiment, the thin film memory cell 1 comprises the stagger structural memory transistor 10 and the coplaner structural selective transistor 11. But the thin film memory cell 1 can otherwise be configured as with each of the following preferred embodiments:

Second Preferred Embodiment

Figure 13:
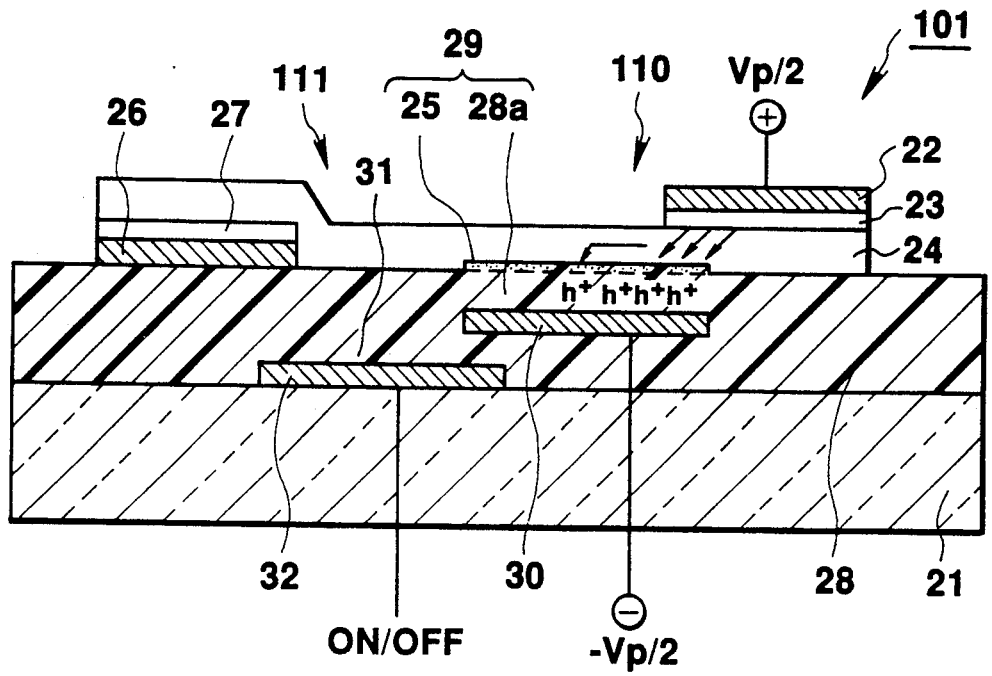
FIG. 13 is an enlarged sectional view presenting a second preferred embodiment of the present invention, and illustrating how to erase data stored in the thin film memory cell.
Figure 14:
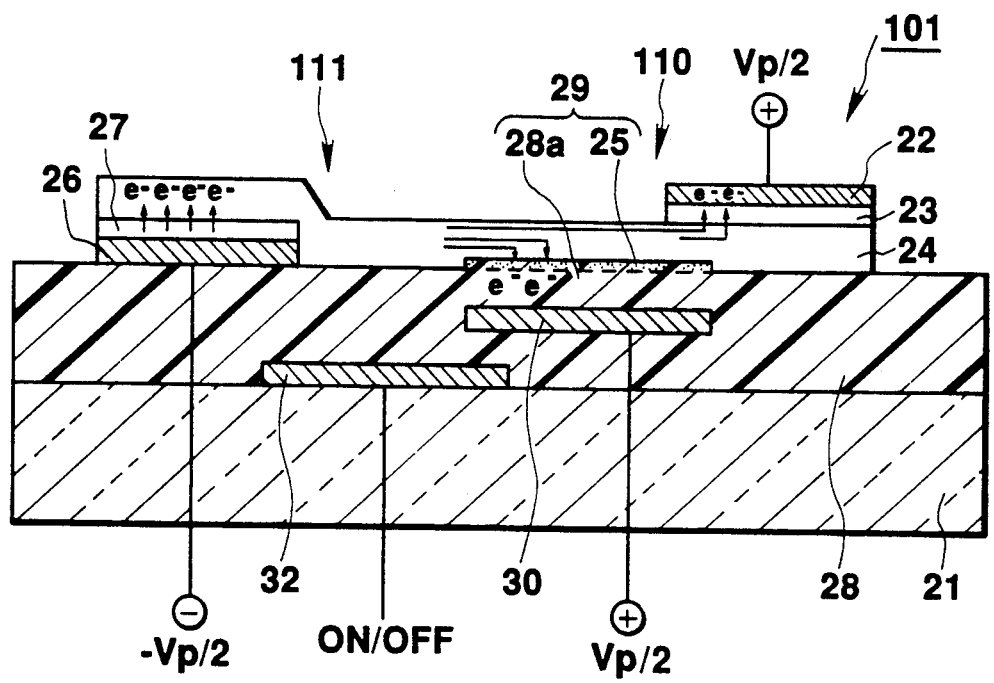
FIG. 14 is an enlarged sectional view illustrating how to write data into the thin film memory cell presented in FIG. 13.

Presented in FIGS. 13 and 14 is a second preferred embodiment of the thin film memory cell according to the present invention. For a thin film memory cell 101 in the second preferred embodiment, a memory transistor has a counter-stagger structure while the selective transistor 111 has a counter-coplaner structure. The elements making up the memory and selective transistors 110 and 111 are identical with those employed in the memory and selective transistors in the first preferred embodiment. In view of this, the thin film memory cell in the second preferred embodiment is omitted from being described here, with the same reference alpha-numeric symbols appropriated for the respective elements corresponding to those used for the memory and selective transistors 10 and 11. FIG. 13 shows an erased state of the thin film memory cell 101, and FIG. 14 a written state thereof.

Third Preferred Embodiment

Figure 15:
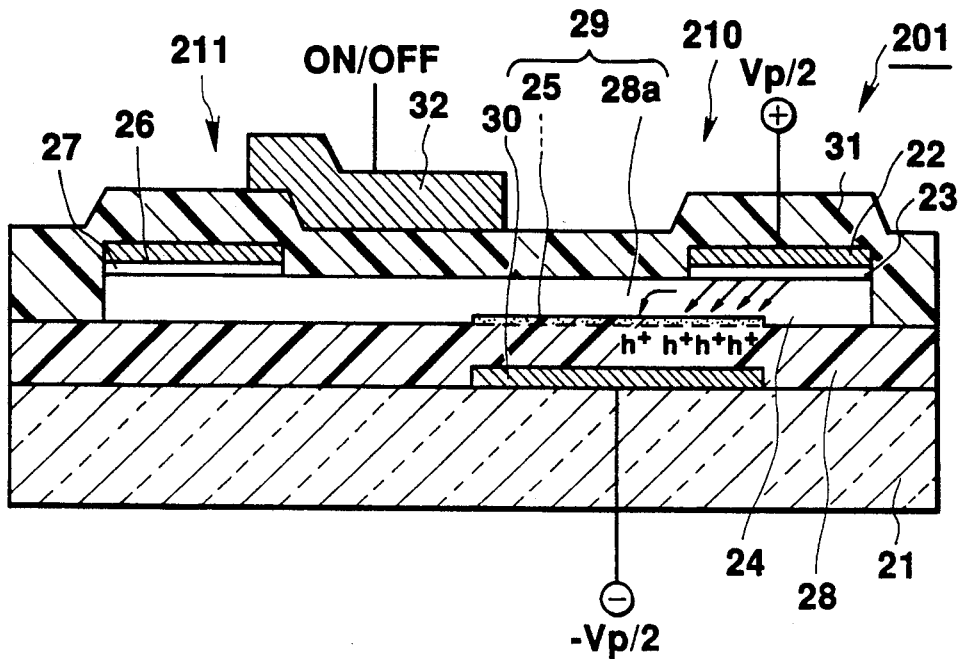
FIG. 15 is an enlarged sectional view presenting a third preferred embodiment of the present invention, and illustrating how to erase data stored in the thin film memory cell.
Figure 16:
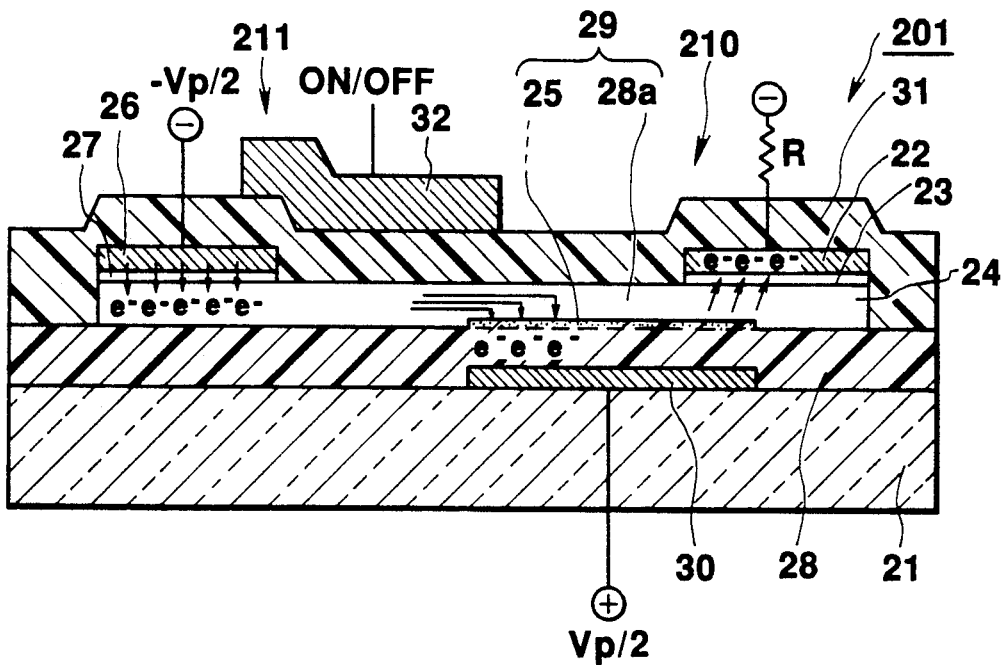
FIG. 16 is an enlarged sectional view showing how to write data into the thin film memory cell given in FIG. 15.

FIGS. 15 and 16 each show a third preferred embodiment of the present invention.

For a thin film memory cell 201 in the third preferred embodiment, a memory transistor 210 has a counter-stagger structure while a selective transistor 211 has a coplaner structure. The elements building up the memory and selective transistors 210 and 211 are the same as those of such respective transistors used in the first preferred embodiment. Therefore, the thin film memory cell in the third preferred embodiment is omitted from being described here, with the identical reference alpha-numeric symbols appropriated for the respective elements corresponding to those used for the memory and selective transistors 10 and 11. FIG. 15 illustrates an erased state of the thin film memory cell 201 and FIG. 16 a written state thereof.

Fourth Preferred Embodiment

Figure 17:
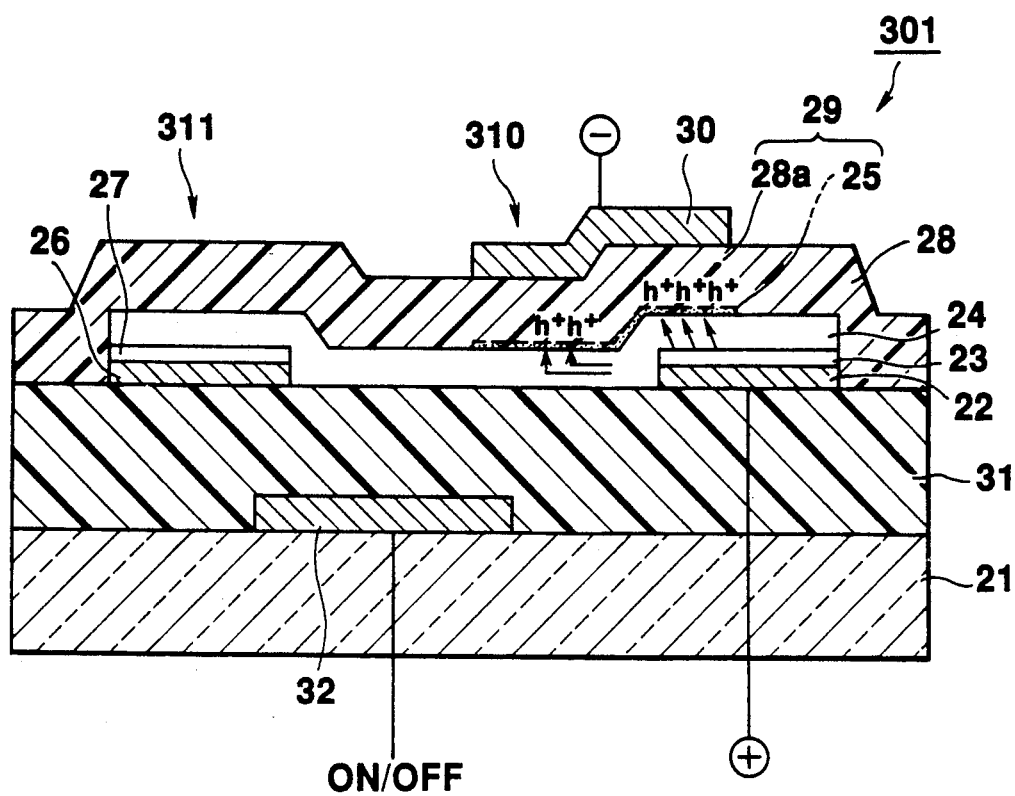
FIG. 17 is an enlarged sectional view presenting a fourth preferred embodiment of the present invention, and illustrating how to erase data stored in the thin film memory cell.
Figure 18:
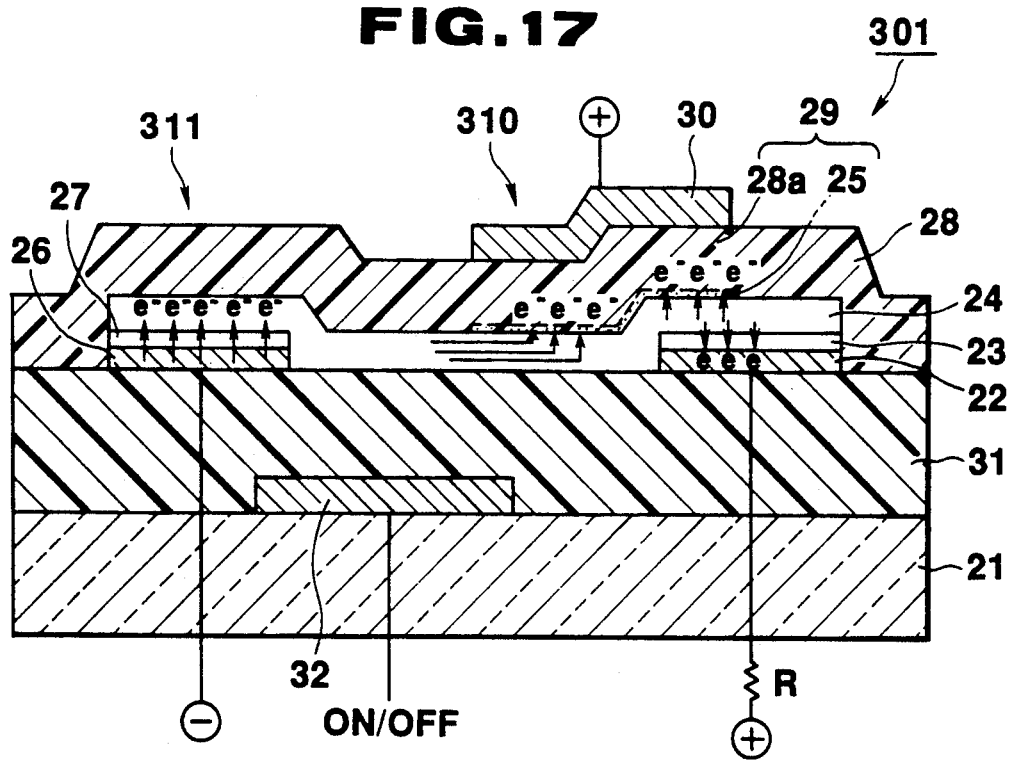
FIG. 18 is an enlarged sectional view showing how to write data into the thin film memory illustrated in FIG. 17.
Figure 19:
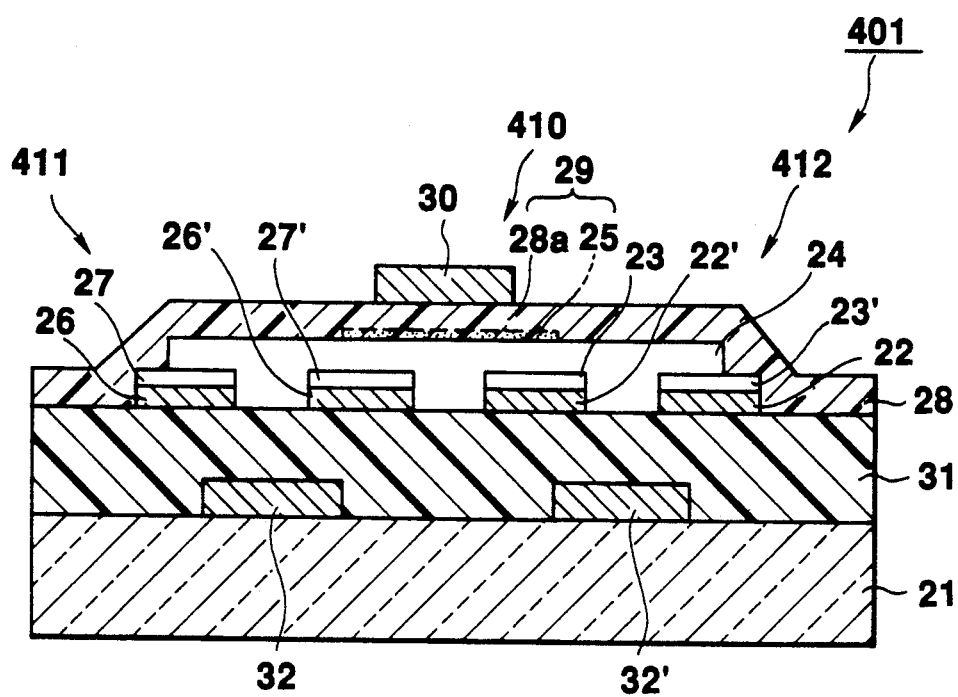
FIG. 19 is an enlarged sectional view of the thin film memory cell of a fifth preferred embodiment of the present invention.

Presented respectively in FIGS. 17 and 18 is the thin film memory cell in a fourth preferred embodiment of the present invention. For the thin film memory cell 301 of this embodiment, a memory transistor 310 has a stagger structure while a selective transistor 311 has a counter-coplaner structure. The elements making up the memory and selective transistors 310 and 311 are fully identical with those employed in the respective memory and selective transistors used in the first preferred embodiment. Therefore, the description about the thin film memory cell in the fourth preferred embodiment is omitted here, with the identical reference alpha-numeric symbols appropriated for the respective elements corresponding to those used for the memory and selective transistors 10 and 11. FIG. 17 illustrates an erased state of the thin film memory 301, and FIG. 18 a written state thereof.

The thin film memory cells respectively of the first through fourth preferred embodiments are commonly of such a configuration wherein the selective transistor is serially coupled electrically to one end of the memory transistor. In such a configuration, a differential potential $|V_p/2|$ is applied to either between the memory gate electrode and source electrode or between the memory gate electrode and drain electrode even in a non-selected memory cells. This differential potential serves, though slightly, to kill the charges trapped in the silicon nitride memory film, resulting in not only reducing the holding time of the memory cell but also interfering with the attempt to make an entire capacity of a memory device larger. To cope with these deficiencies, arranging the selective transistor on both sides of the memory transistor in series electrical connection therewith suffices. Some additional preferred embodiments showing such a thin film memory cell are presented hereunder.

Fifth Preferred Embodiment

Illustrated respectively in FIGS. 19 through 23 is the thin film memory cell of a fifth preferred embodiment according to the present invention.

A thin film memory cell 401 comprises a memory transistor 410, first selective transistor 411 serially coupled electrically to the drain electrode of said memory transistor 410, and a second selective transistor 412 electrically coupled serially to the source electrode of said memory transistor 410. The memory transistor 410 is of a stagger structure comprising a memory gate electrode 30, a memory gate insulating film 29, a semiconductor layer 24, an intermediate drain electrode 26', and an intermediate source electrode 23. The first selective transistor 411 has a counter-coplaner structure comprising a selective gate electrode 32, a selective gate insulating film 31, a drain electrode 26, and an intermediate drain electrode 26'. The second selective transistor 412 has a counter-coplaner structure comprising a selective gate electrode 32', a selective gate insulating film 31, a source electrode 22, and an intermediate source electrode 22'. In this embodiment, the silicon nitride memory film 25 is formed in a manner that said memory film will be overlapped with substantial entire area of the intermediate drain electrode 26' and the intermediate source electrode 22'. Also between the intermediate drain electrode 26' and the semiconductor layer 24, and between the intermediate source electrode 22' and the semiconductor layer 24, there are formed respective n+ high density impurity layers 27' and 23. The memory gate electrode 30 is formed at such a location where said memory gate electrode 30 is partially overlapped with each end portion of the n+ high density impurity layer 27' and the n+ high density impurity layer 23. The remaining elements are identical with those used in the first preferred embodiment. Reflecting this, the description of the thin film memory cell in this embodiment is omitted here, with the same reference alpha-numeric symbols appropriated for the respective elements corresponding to those employed for the memory and selective transistors 10 and 11.

Now with reference to FIGS. 20 through 23, the mechanism of erasing and writing in the fifth preferred embodiment is described hereunder.

First, how the erasure is implemented is described hereunder.

Figure 20:
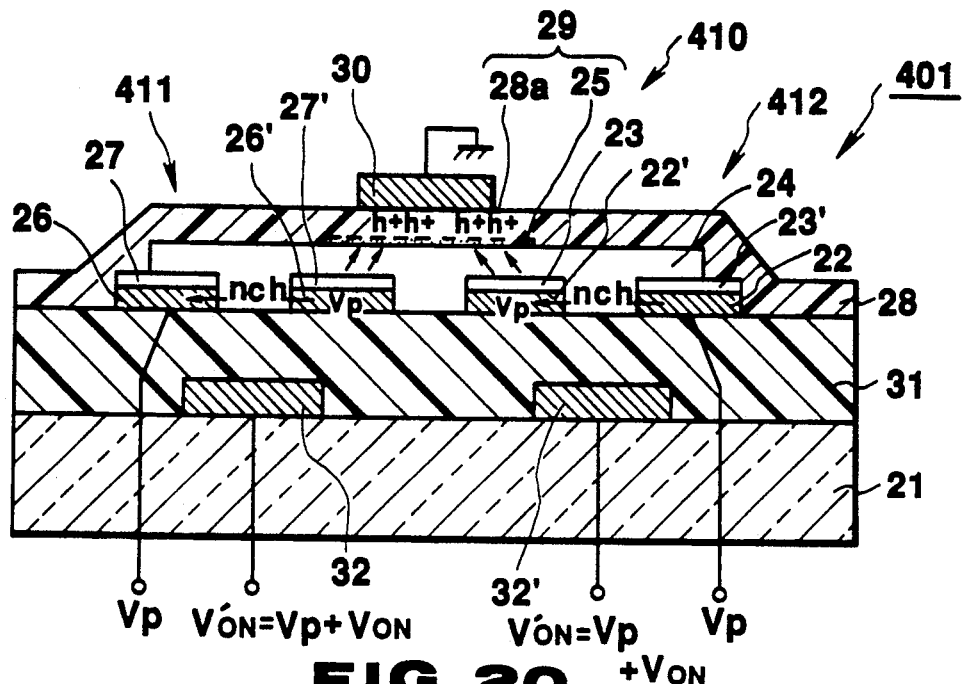
FIG. 20 is an enlarged sectional view illustrating how to erase data stored in the thin film memory cell given in FIG. 19.

FIG. 20 indicates the voltages applied to the respective parts of the thin film memory cell. The voltage applied to the memory gate electrode 30 is regulated at the ground potential, $V_p$ is impressed to the drain electrode 26, and the source electrode 22. In the meanwhile, $V_{ON'} = V_p + V_{ON}$ is applied to the selective gate electrodes 32 and 32'. $V_{ON}$ is a threshold voltage in the $V_G$ - $I_D$ characteristic of the selective transistor presented in FIG. 6. Therefore, assuming that $V_p = 20$ V and $V_{ON} = 5$ V, $V_{ON'}$ becomes 25 V. Under the condition wherein these above-remarked voltages are applied to the drain electrode 26, source electrode 22, and the selective gate electrodes 32 and 32', both the selective transistors 411 and 412 are turned on. In other words, an N-channel is formed between the drain electrodes 26 and an intermediate drain electrode 26' of the selective transistor 411, whereby the voltage of the intermediate drain electrode 26' changes from floating to a $V_p$. Further, the N-channel is formed between the source electrode 22 and an intermediate source electrode 22', whereby the voltage so far maintained floating within the intermediate source electrode 22' becomes $V_p$. This results in that so long as the memory transistor 410 is concerned, the potential at the memory gate electrode 30 becomes $-V_p$ with reference to the potentials respectively at the intermediate drain electrode 26' and the intermediate source electrode 22'. Thereby, the positive holes are trapped in the silicon nitride memory film 25, and the erased state is achieved.

Figure 21:
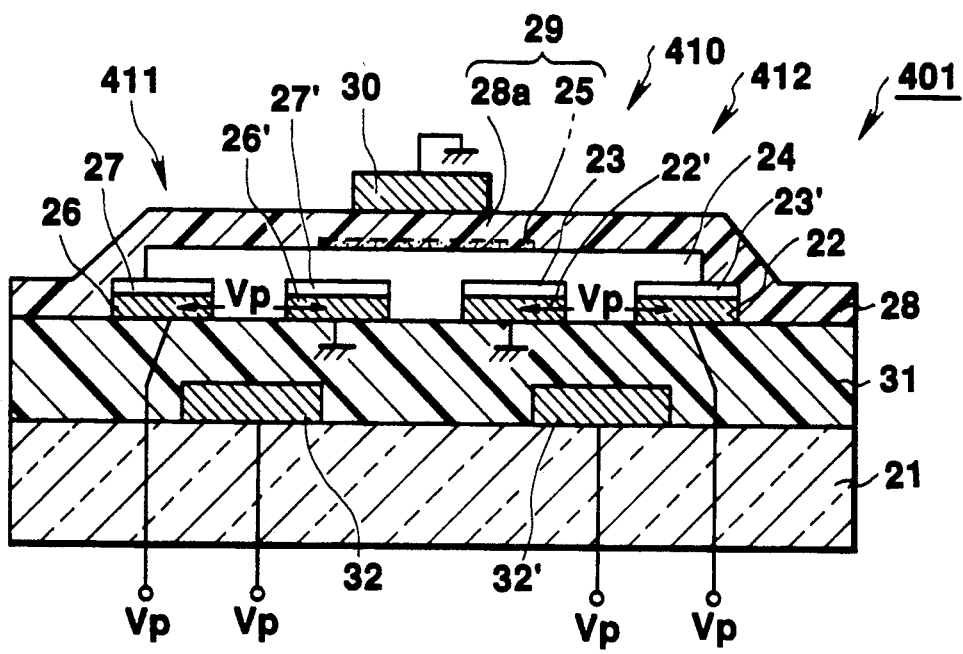
FIG. 21 is an enlarged sectional view illustrating erasing operation for a non-selected thin film memory cell presented in FIG. 20.

FIG. 21 shows the voltages at the respective part in the case where the contents written in the thin film memory cell 401 are not erased. Compared with FIG. 20, only the voltage applied respectively to the selective gate electrodes 32 and 32' are different from those specified in said figure.

For the case where the thin film memory cell 401 does not go through erasure of its contents, $V_p$ of an identical potential is applied to the selective gate electrodes 32 and 32', as well as the drain electrode 26 and source electrode 22, respectively. $V_p$ is applied to the selective gate electrodes 32 and 32', which is the same an the voltage applied to the drain electrode 26 and the source electrode 22. Both the selective transistors 411 and 412 stay in the OFF-state, whereby a drain voltage of $V_p$ at the selective transistor 411 is interrupted by the channel portion with a high impedance, whereby the voltage at the intermediate drain electrode 26' is gets floating. Further, a source voltage of $V_p$ at the selective transistor 412 is likewise interrupted by the channel portion with a high impedance, whereby the voltage at the intermediate source electrode 22' gets floating. This results in that, as far as the memory transistor 410 is concerned, the voltage at the memory gate electrode 30 is substantially identical with both potentials at the intermediate drain electrode 26' and the intermediate source electrode 22', with the memory contents remaining unchanged.

Next, how the writing is effected in the thin film memory cell 401 is described hereunder.

Figure 22:
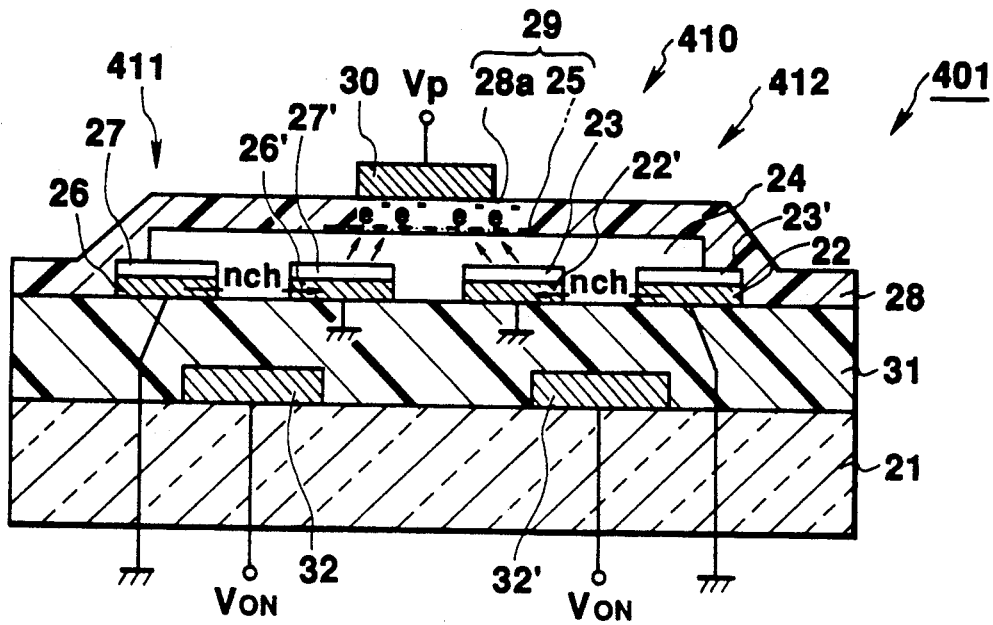
FIG. 22 is an enlarged sectional view illustrating how to write data into the thin film memory cell presented in FIG. 19.

In FIG. 22, there are indicated the voltages applied to the respective parts of the thin film memory cell 401 when data is written into said thin film memory cell. The memory gate electrode 30 is applied with $V_p$ while the voltages at the drain electrode 26 and the source electrode 22 are at the ground potential. Meanwhile, $V_{ON}$ is applied the selective gate electrodes 32 and 32', wherein said $V_{ON}$ is a threshold voltage in the $V_G$ - $I_D$ characteristics of the selective transistor given in FIG. 6. With these voltages applied such as in the foregoing, both selective transistors 411 and 412 are turned on. In other words, an N-channel is formed between the drain electrode 26 and the intermediate drain electrode 26' of the selective transistor 411. As a result, the voltage far kept floating within the intermediate drain electrode 26' becomes the ground potential. Further, between the source electrode 22 and the intermediate source electrode 22' of the selective transistor 412, there is formed the N-channel, whereby the voltage far maintained floating within the intermediate source electrode 22' is rendered the ground potential. Thus so far as the memory transistor 410 is concerned, the voltage at the memory gate electrode 30 becomes $+V_p$ with reference to both potentials of the intermediate drain electrode 26' and the intermediate source electrode 22'. Thereby, the electrons are getting trapped in the silicon nitride memory film, and data is written into the memory transistor 410.

Figure 23:
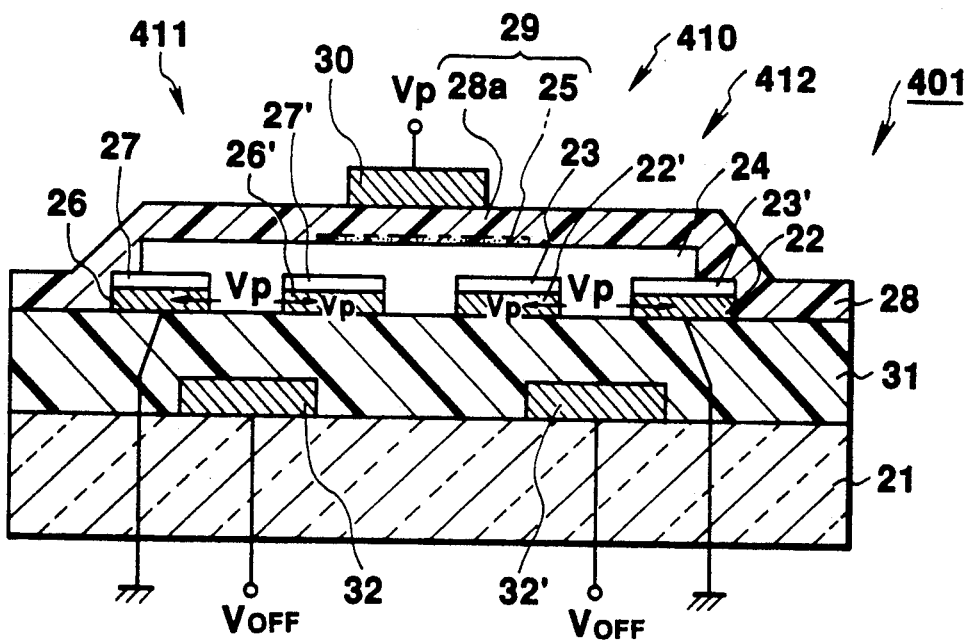
FIG. 23 is an enlarged sectional view illustrating writing operation for a non-selected thin film memory cell presented in FIG. 22

Shown in FIG. 23, are the voltages impressed at the respective part of the thin film memory cell 401 in the case where said thin film memory cell does not go through the writing. The difference which FIG. 23 shows in reference to FIG. 22, lies only in the voltage applied to the selective gate electrodes 32 and 32'. Where the thin film memory cell does not undergo the writing, $V_{OFF}$ is applied to the respective selective gate electrodes 32 and 32'. In this example, $V_{OFF}$ may be the ground potential which is applied to the drain electrode 26 and the source electrode 22. Under the condition, both the selective transistors 411 and 412 stay in the OFF-state. Applying a write voltage of $V_p$ to the memory gate electrode 30 of the memory transistor 410 entails the emergence of $V_p$ at both the intermediate drain electrode 26' and the intermediate source electrode 22' where both potentials have so far been kept floating. Nevertheless, as both the selective transistors 411 and 412 remain in the OFF-state, the write voltage $V_p$ is interrupted by the channel portions with the high impedance of the selective transistors 411 and 412. Whereby, in the memory transistor 410, the voltage at the memory gate electrode 30 is identical with the potentials of the intermediate drain electrode 26' and the intermediate source electrode 22', with the memory contents remaining unchanged.

In the above-described embodiment, the writing and the erasure are performed by using the majority carrier. For the mechanism of the writing and the erasing by use of the majority carrier, the drain current is not so large, thus giving rise to a deficiency which will result in impracticality to fabricate a large capacity memory device. Therefore, a further embodiment of such a thin film memory cell devised to compensate for the above-mentioned deficiency whereby to provide practicality to manufacture a further expanded capacity memory device is quoted hereunder.

Sixth Preferred Embodiment

Figure 24:
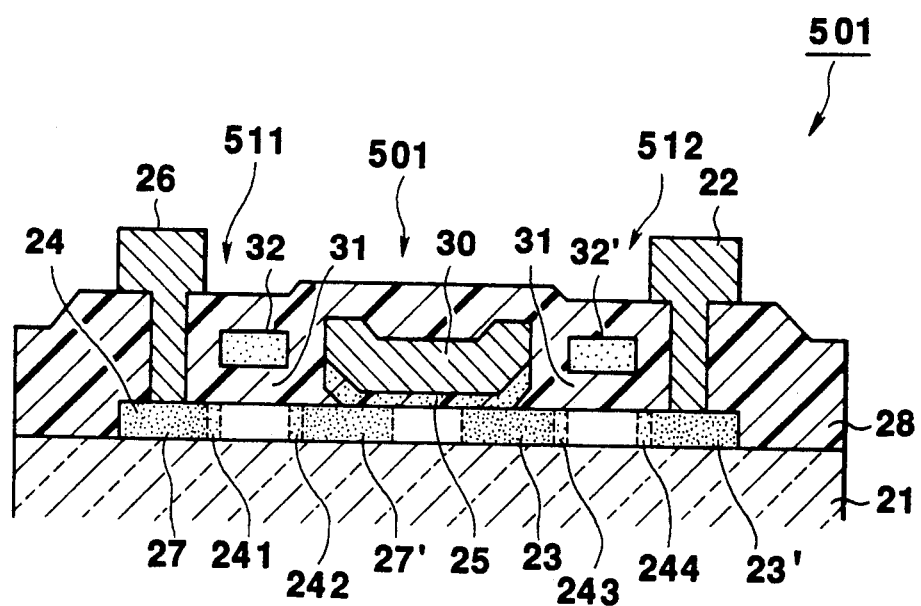
FIG. 24 is an enlarged sectional view of the thin film memory cell illustrating a sixth preferred embodiment of the present invention.
Figure 25:
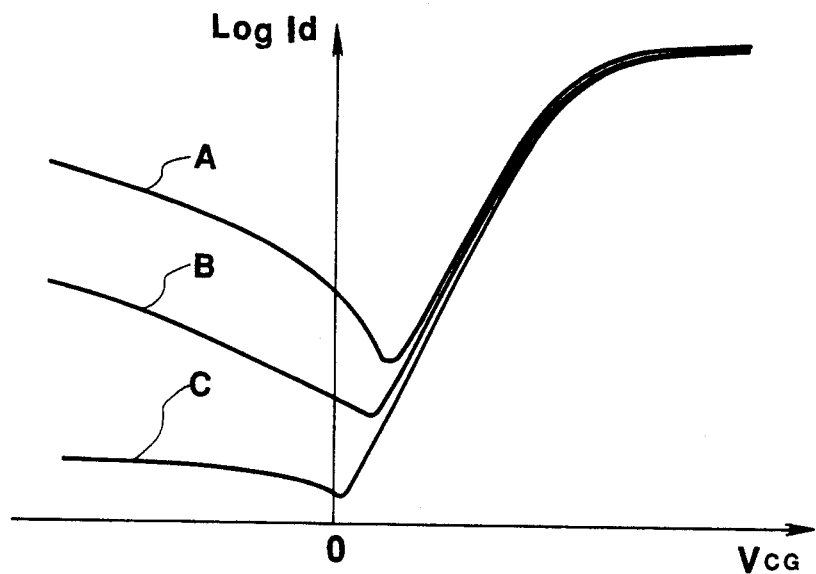
FIG. 25 is a diagram showing the $V_{CG}$-$I_d$ characteristic illustrating the serviceability of a selective transistor presented in FIG. 24.
Figure 26:
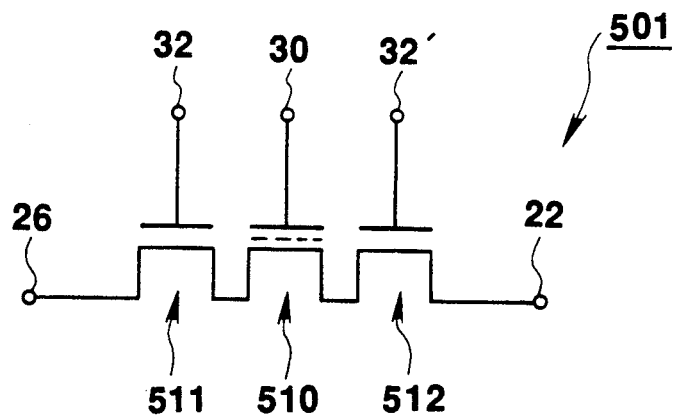
FIG. 26 is an equivalent circuit diagram of the thin film memory cell illustrated in FIG. 24.

Presented respectively in FIGS. 24 through 26 is a sixth embodiment of the thin film memory cell according to the present invention. The thin film memory cell in this embodiment comprises a memory transistor 501 with a coplaner structure and selective transistors 511 and 512 serially and electrically coupled to the drain and source of said memory transistor 510 respectively. Compared with the preceding embodiments, the present embodiment has a configurational distinction that the phosphorus ions, etc. are doped into the semiconductor layer 24 by diffusion, whereby the n+ high density impurity layers 27, 27', 23, and 23' are formed. Though each of these n+ high-density impurity layers corresponds to the element given the same reference alpha-numeric symbol allocated to said each in the fifth preferred embodiment, these n+ high density impurity layers are not deposited on the surface of the semiconductor layer 24 but are formed within said semiconductor layer 24, causing some difference from the preceding embodiments.

The silicon nitride memory film 25 is formed of one layer of a silicon nitride film with an Si/N ratio of more than stoichiometric mixture ratio 0.75. The memory gate electrode 30 is lapped over each end of the n+ high density impurity layers 27 and 27' to provide a configuration capable of generating electron-hole pairs, similarly to each of the preceding embodiments. For the selective transistors 511 and 512, LDD (Lightly Doped Drain) structure is adopted, likewise with a single-crystal semiconductor device. Concretely in this regard, the selective transistor 511 has n− low density impurity layers 241 and 242 formed between the selective gate electrode 32 and the n+ high density impurity layer 27, and also between the selective gate electrode 32 and the n+ high density impurity layer 27'. In the meanwhile, the selective transistor 512 has n− low density impurity layers 244 and 243 formed between the selective gate electrode 32' and the n+ high density impurity layer 23, and between the selective gate electrode 32' and the n+ high density impurity layer 23'. The n− low density impurity layer serves not only to improve the withstanding voltage but also to lessen a leak current and improve assuredness of the N-channel type run, namely, the certainly of a single charge run using the defined carriers only. FIG. 25 is a $V_{CG}$ - $I_d$ characteristic diagram showing a relativity of a gate voltage $V_{CG}$ and a drain current $I_d$ of the selective transistor 511 or 512. Curves A and B in the diagram each stand for the case where only the n+ high density impurity layers 27 and 27' are formed, with the n− low density impurity layers unformed. On the other hand, curve C denotes another case where the n− low density impurity layers 241 and 241 are formed. The curve A further stands for the case where the selective gate electrode 32 is arranged while lapping itself over the n+ high density impurity layers 27 and 27'. Meanwhile, the curve B presents stands for the case where the selective gate electrode 32 is arranged in self-alignment with the n+ high density impurity layers 27 and 27'. Referring to these characteristic diagrams, it will be clearly understood that the characteristics represented by the curve C shows with the leaset leak current and are suited for the N-channel type run. Even in the case with the curve B, it is feasible to suppress the leak current to a relatively small magnitude. However, in this case, such a structure wherein the selective gate electrode is lapped over the n+ high density impurity layer, must be avoided. FIG. 26 is an equivalent circuit of the thin film memory cell 501. In FIG. 26, the selective transistor 512 is added to the thin film memory cell give in FIG. 10B. It suffices if the voltage application particular as with the fifth preferred embodiment are followed to implement erasing and writing in the thin film memory cell 501.

Next, how the thin film memory cell 501 is manufactured is described hereunder.

By using the plasma CVD technique or the like, a polysilicon layer is deposited on the entire surface of the insulating substrate 21. The deposited polysilicon layer is etched to form the semiconductor layer 24 with the respective areas corresponding to the individual element regions shown in FIG. 24. The semiconductor layer 24 are covered with a photoresist, and then, openings corresponding to the n+ high density impurity layers 27, 27', 23, and 23' provided in the semiconductor layer 24 ar formed by the photolithography technique. Next, donors such as phosphorus ions, etc. is implanted in the surface of the semiconductor layer 24 through the openings corresponding to the n+ high density impurity layers 27, 27', 23 and 23'. Subsequently, the remaining photoresist is removed, and using the low pressure CVD technique or the like, the silicon nitride memory film is formed approximately at the center over the surface of the semiconductor layer 24. It is efficient to use silicon-rich silicon nitride whose Si/N ratio is larger than the stoichiometrical ratio. However, it is still allowed to fabricate such a memory film laminate configuration as comprises a tunnel oxide film and a charge trap insulating film or the tunnel oxide film and a floating gate layer. For such a memory film laminate configuration, it is significant that the silicon nitride memory film 25 should be overlaped with a part of each of the n+ high density impurity layers 27' and 23'. Next, over the surface of the silicon nitride memory film 25, the memory gate electrode 30 is formed in the dimensions approximately identical with those of said memory film 25. The memory gate electrode 30 is made from one of widely known materials, such as aluminum, polysilicon with a certain dopant diffused therein. In a subsequent step, there is formed the selective gate insulating film 31 over the local surfaces of the semiconductor layer 24. Though in FIG. 24, there is illustrated the selective gate insulating film in one layer, practically, said selective gate insulating film 31 comprises two layers, an upper one and a lower one; at this stage of thin film memory cell processing, a lower layer of the selective gate insulating film is provided. For the selective gate insulating film, silicon oxide, silicon nitride, or the like may be employed. If silicon nitride is used, a value of the Si/N ratio must be smaller than that of the stoichiometrical ratio.

Then, on the lower layer of said selective gate insulating film 31, phosphorus ion-diffused polysilicon is deposited, with etching to follow thereby to form the selective electrode gate 32 narrower than the gap between the n+ high density impurity layers 27 and 27', and the selective gate electrode 32' also narrower than the gap between the n+ high density impurity layers 23 and 23'. Next, the surface area of the semiconductor layer 24 which corresponds to n− low density impurity layers 241, 242, 243, and 244 are implanted with phosphorus ions or other dopant. Here, the n− low density impurity layers 241 through 244 are formed in self-alignment with the selective gate electrode 32 or 32'. This self-alignment mechanism serves to assure improved efficiency and high accuracy of production. Thereafter, annealing is implemented to diffuse the dopant previously implanted in the local surfaces corresponding to both the n+ high density impurity layers 27, 27', 23, and 23' stated, and the n− low density impurity layers 241, 242, 243, and 244, respectively in the semiconductor layer 24, whereby within said semiconductor 24, there are formed said n+ high density impurity layers 27, 27', 23, and 23', and said n− low density impurity layers 241, 242, 243 and 244. Then, over the lower layer of the selective gate insulating film 31, an upper layer of the selective gate insulating film 31 is provided. In the selective gate insulating film 31 contact holes are formed reaching the n+ high density impurity layers 27 and 23'. Subsequently, using a spattering technique or the like, a certain metal is deposited not only within the contact hole provided in the selective gate insulating film 31, and the exterior surface of the selective gate insulation film 31. The layer of said deposited metal is etched to produce the drain electrode 26 and the source electrode 22 in given respective profiles, whereby the thin film memory cell 501 presented in FIG. 24 is obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A memory cell comprising:

a thin film memory device including a first thin film semiconductor layer, an insulating memory gate layer formed on said first thin film semiconductor layer and having a charge trap function, a memory gate electrode formed on said insulating memory gate layer, and a high density impurity region disposed in contact with said first thin film semiconductor layer, said memory gate electrode having a portion partly covering said high density impurity region; and a thin film selective device for selecting said thin film memory device and including a second thin film semiconductor layer, an insulating selective gate layer formed on said second thin film semiconductor layer and having a charge non-trap function, and a selective gate electrode formed on said insulating selective gate layer, said first thin film semiconductor layer of said thin film memory device and said second thin film semiconductor layer of said thin film selective device being contiguously formed.

2. The memory cell according to claim 1, wherein said first thin film semiconductor layer includes a second high density impurity region.

3. The memory cell according to claim 1, wherein said second thin film semiconductor layer includes a thin high density impurity region.

4. The memory cell according to claim 1, wherein said first and said second thin film semiconductor layers are made of amorphous silicon or polysilicon.

5. The memory cell according to claim 1, wherein said high density impurity layer includes phosphorus.

6. The memory cell according to claim 1, wherein said high density impurity layer is coupled to said second thin film semiconductor layer.

7. A memory-transistor cell comprising:

a thin film semiconductor layer including a first, a second, a third and a fourth high density impurity regions;

an insulating memory gate layer formed on said thin film semiconductor layer and having a first and a second portion respectively formed on said second and said third high density impurity regions;

a memory gate electrode formed on said insulating memory gate layer and having a first and a second portions respectively located above said second and said third high density impurity regions;

a first selective gate electrode disposed between said first and second high density impurity regions;

a second selective gate electrode disposed between said third and said fourth high density impurity regions; and an insulating selective gate layer interposed between said thin film semiconductor layer and said first selective gate electrode and between said thin film semiconductor layer and said second insulating selective gate layer.

8. The memory-transistor cell according to claim 7, wherein said thin film semiconductor layer includes a source and a drain regions which are connected to said second and said third high density impurity regions, respectively.

9. The memory-transistor cell according to claim 7, wherein said thin film semiconductor layer includes a source and a drain regions which comprises said first and said second high density impurity regions, respectively.

10. The memory-transistor cell according to claim 7, wherein said first selective gate electrode has a length shorter than a space between said first and said second high density impurity regions.

11. The memory-transistor cell according to claim 7, wherein said thin film semiconductor layer includes a first low density impurity region located between said first high density impurity region and said first selective gate electrode.

12. The memory-transistor cell according to claim 7, wherein said second selective gate electrode has a length shorter than a space between said third and said fourth high density impurity regions.

13. The memory-transistor cell according to claim 7, wherein said thin film semiconductor layer includes a second low density impurity region located between said fourth high density impurity region and said second selective gate electrode.

14. A memory cell comprising:
- a threshold voltage alterable thin film transistor including;
- a first thin film semiconductor layer having a first and a second n+ regions,
- an insulating memory gate layer having means for trapping electrons and positive holes,
- a memory gate electrode formed on said insulating memory gate layer, and
- charge-generating means for generating electron-positive hole pairs;
- a first thin film selective device electrically coupled to said thin film memory device and including:
- a second thin film semiconductor layer having a third n+ region,
- a first selective gate electrode located between said first and said third n+ regions, and
- a first electron flow generating means for forming n channel between said first and said third n+ regions; and
- a second thin film selective device electrically coupled to said thin film memory device and including:
- a third thin film semiconductor layer having a fourth n+ region,
- a second selective gate electrode located between said second and said fourth n+ regions, and
- a second electron flow generating means for forming n channel between said second and said fourth n+ regions.

* * * * *